(12) United States Patent
Park et al.

(10) Patent No.: US 11,528,807 B2
(45) Date of Patent: Dec. 13, 2022

(54) BONDING DEVICE

(71) Applicant: Samsung Display Co., Ltd., Yongin-si (KR)

(72) Inventors: Jungseon Park, Cheonan-si (KR); Taeyoung Park, Asan-si (KR); Jun-Hee Lee, Seoul (KR); Hyunwoo Lee, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 30 days.

(21) Appl. No.: 17/147,446

(22) Filed: Jan. 12, 2021

(65) Prior Publication Data

US 2021/0289632 A1    Sep. 16, 2021

(30) Foreign Application Priority Data

Mar. 12, 2020    (KR) .................. 10-2020-0030675

(51) Int. Cl.
*B32B 41/00* (2006.01)
*H05K 3/10* (2006.01)
*H05K 3/32* (2006.01)

(52) U.S. Cl.
CPC ............. *H05K 3/103* (2013.01); *H05K 3/323* (2013.01); *H05K 2203/1105* (2013.01)

(58) Field of Classification Search
CPC .......... H05K 3/103; H05K 3/323; H05K 2203/1105; H05K 1/147; H05K 2201/10128; G02F 1/13452; G02F 1/1303; G02F 1/1345; H01L 51/56; G09F 9/33
USPC .............. 156/60, 64, 350, 351, 378, 379
See application file for complete search history.

(56) References Cited

U.S. PATENT DOCUMENTS

2021/0030518 A1    9/2021    Lee et al.

FOREIGN PATENT DOCUMENTS

| JP | 3437003 | | 8/2003 |
|---|---|---|---|
| JP | 2010067922 A | * | 3/2010 |
| KR | 10-1796930 | | 11/2017 |
| KR | 10-2004606 | | 7/2019 |
| KR | 10-2021-0119619 | | 10/2021 |

* cited by examiner

*Primary Examiner* — Michael N Orlando
*Assistant Examiner* — Joshel Rivera
(74) *Attorney, Agent, or Firm* — H.C. Park & Associates, PLC

(57) ABSTRACT

A bonding device includes: a bonding head configured to move in a vertical direction; a stage disposed under the bonding head and including a first portion, the first portion having a first plane surface facing the bonding head and a first support surface opposite to the first plane surface; and a supporter disposed under the stage and including a second support surface facing the first support surface, wherein the second support surface of the supporter has a recess portion having a first radius of curvature.

20 Claims, 13 Drawing Sheets

BONDING DEVICE

CROSS-REFERENCE TO RELATED APPLICATION

This application claims priority from and the benefit of Korean Patent Application No 10-2020-0030675, filed on Mar. 12, 2020, which is hereby incorporated by reference for all purposes as if fully set forth herein.

BACKGROUND

Field

Exemplary implementations of the invention relate generally to a bonding device and more particularly, to a bonding device for bonding a driver to a side surface of a display panel.

Discussion of the Background

In general, a display device includes a display panel including pixels for displaying images, a scan driver for providing scan signals to the pixels, and a data driver for providing data voltages to the pixels. The scan driver and the data driver are connected to the display panel.

The scan driver generates the scan signals and provides the generated scan signals to the pixels. The data driver generates the data voltages and provides the generated data voltages to the pixels. The pixels receive the data voltages in response to the scan signals and display the images.

An area, in which the scan driver and the data driver are disposed, is called a bezel area. In recent years, a technique for bonding the drivers to a side surface of the display panel has been developed to reduce the bezel area.

The above information disclosed in this Background section is only for understanding of the background of the inventive concepts, and, therefore, it may contain information that does not constitute prior art.

SUMMARY

Applicant has discovered that when a driver is bonded to a side surface of a display panel by a bonding device, it is difficult to adjust or control the horizontal level of the side surface of the display panel.

Bonding devices constructed according to the principles and exemplary implementations of the invention are capable of precisely adjusting and controlling the horizontal level of the side surface of the display panel so that the side surface of the display panel is substantially parallel to a lower surface of a bonding head of the bonding devices. Consequently, the bonding devices may perform the bonding process uniformly on the side surface of the display panel and the driver such that the bonding quality between the side surface of the display panel and the driver is improved, and defects of the display device are reduced.

Additional features of the inventive concepts will be set forth in the description which follows, and in part will be apparent from the description, or may be learned by practice of the inventive concepts.

According to an aspect of the invention, a bonding device includes: a bonding head configured to move in a vertical direction; a stage disposed under the bonding head and including a first portion, the first portion having a first plane surface facing the bonding head and a first support surface opposite to the first plane surface; and a supporter disposed under the stage and comprising a second support surface facing the first support surface, wherein the second support surface of the supporter has a recess portion having a first radius of curvature.

The first support surface of the first portion of the stage may include a curved surface convex in a downward direction, and the curved surface may have a second radius of curvature.

The first radius of curvature of the recess portion of the second support surface of the supporter may be equal to the second radius of curvature of the curved surface of the first portion of the stage.

The recess portion of the second support surface of the supporter may have an area greater than an area of the first support surface of the first portion of the stage when viewed in plane.

The stage further may include a second portion extending from one side of the first portion of the stage in the vertical direction, and the second portion of the stage may include a second plane surface substantially perpendicular to the first plane surface of the first portion of the stage.

The bonding device may further include a clamp disposed to be spaced apart from the second portion of the stage in a horizontal direction substantially perpendicular to the vertical direction.

The clamp may be configured to move in the horizontal direction to be closed to or far away from the second plane surface of the second portion of the stage.

The bonding head may be configured to apply a heat and a pressure to a target object.

The bonding head may be configured to apply an ultrasonic wave to a target object.

The bonding head may be configured to irradiate a laser beam to a target object.

The bonding device may further include at least one ball caster rotatably coupled to the first support surface.

The first support surface of the first portion of the stage may be substantially parallel to the first plane surface of the first portion of the stage.

The bonding device may further include a target object disposed on the stage, wherein one side surface of the target object may be disposed on the first plane surface of the first portion of the stage, and another side surface of the target object which is opposite to the one side surface of the target object, may face the bonding head.

According to another aspect of the invention, a bonding device includes: a stage comprising a first portion, the first portion having a first plane surface on which a first side surface of a display panel is disposed and a first support surface opposite to the first plane surface; a bonding head disposed on the stage and configured to move to be close to or far away from a second side surface of the display panel opposite to the first side surface of the display panel; and a supporter disposed under the stage and comprising a second support surface facing the first support surface and having a curved surface area.

The second support surface of the supporter may have a curved surface concave in a downward direction, and the first support surface of the first portion of the stage may have a curved surface convex in the downward direction.

The first support surface of the first portion of the stage may have a radius of curvature equal to a radius of curvature of the second support surface of the supporter.

The bonding head may be configured to bond a flexible circuit board disposed on the second side surface to the second side surface using one of a thermal-compression bonding method, an ultrasonic bonding method, and a laser bonding method.

The bonding device may further include one or more ball casters disposed between the first support surface of the first portion of the stage and the second support surface of the supporter, wherein the first support surface of the first portion of the stage is substantially parallel to the first plane surface of the first portion of the stage.

The bonding device may further include a clamp, wherein: the stage comprises a second portion having a second plane surface, the second plane surface substantially perpendicular to the first plane surface of the first portion of the stage, on which a second surface of the display panel is placed, and the clamp may include a third plane surface being selectively in contact with a first surface of the display panel opposite to the second surface of the display panel.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
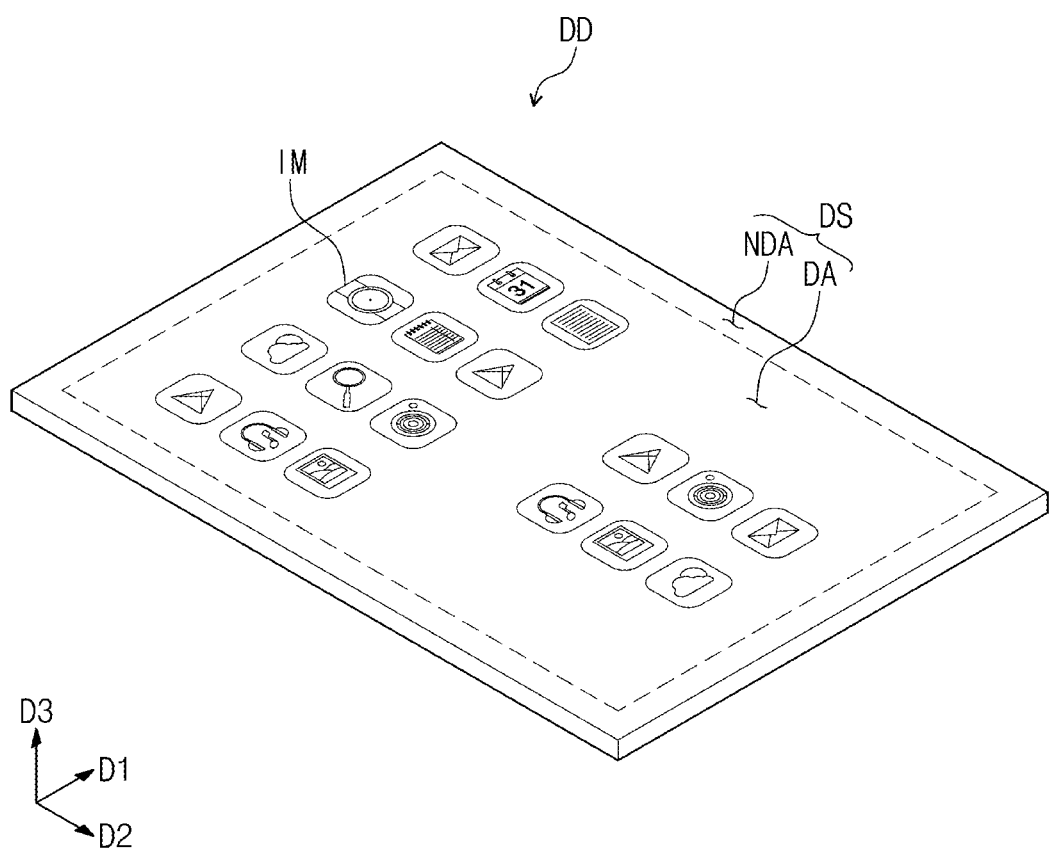
FIG. 1 is a perspective view of an exemplary embodiment of a display device constructed according to the principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, the inventive concepts will be explained in detail with reference to the accompanying drawings.

FIG. 1 is a perspective view of an exemplary embodiment of a display device DD constructed according to the principles of the invention.

Referring to FIG. 1, the display device DD according to the exemplary embodiment may have a board shape defined by short sides extending in a first direction D1 and long sides extending in a second direction D2 intersecting the first direction D1. Hereinafter, the expression "when viewed in plane" means a state of being viewed in a third direction D3 perpendicular to a plane defined by the first direction D1 and the second direction D2. When viewed in plane, the display device DD may have a rectangular shape, however, exemplary embodiments are not limited thereto or thereby. The display device DD may have a variety of shapes, such as a circular shape or a polygonal shape.

An upper surface of the display device DD may be defined as a display surface DS and may be a plane defined by the first direction D1 and the second direction D2. Images IM generated by the display device DD may be provided to a user through the display surface DS.

The display surface DS may include a display area DA and a non-display area NDA around the display area DA. The display area DA may display the images, and the non-display area NDA may not display the images. The non-display area NDA may surround the display area DA and may define a bezel area of the display device DD.

Figure 2:
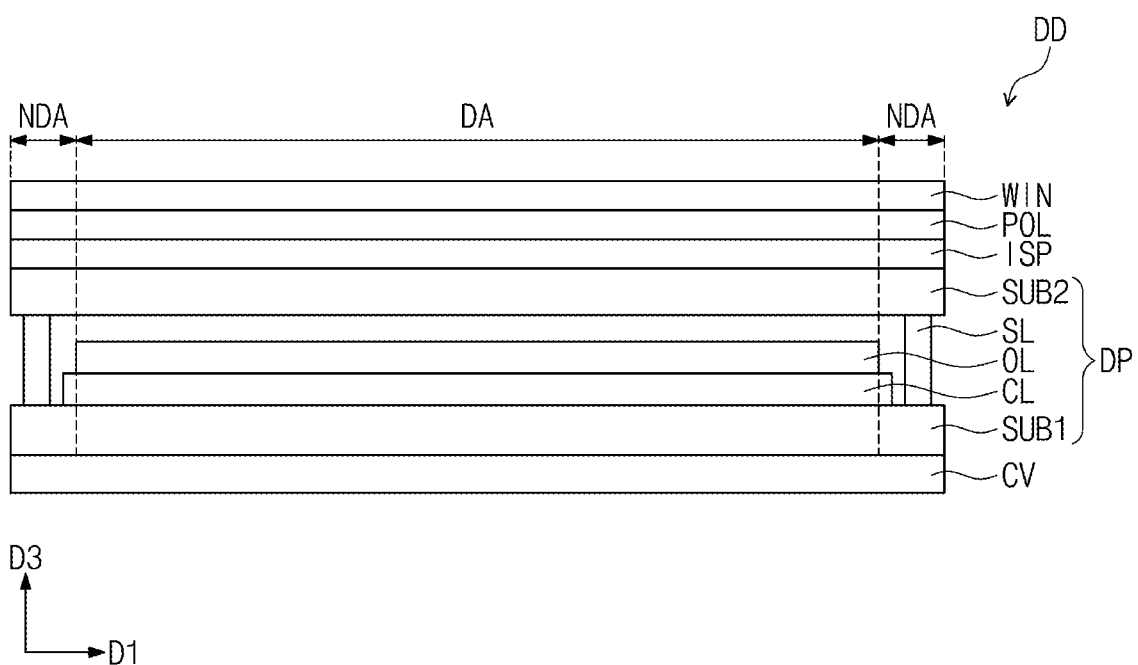
FIG. 2 is a cross-sectional view of the display device of FIG. 1.

FIG. 2 is a cross-sectional view of the display device DD of FIG. 1.

Referring to FIG. 2, the display device DD may include a display panel DP, an input sensing unit ISP disposed on the display panel DP, an anti-reflective layer POL disposed on the input sensing unit ISP, a window WIN disposed on the anti-reflective layer POL, and a cover panel CV disposed under the display panel DP.

The display panel DP may be a light emitting type display panel, however, exemplary embodiments are not limited thereto. For example, the display panel DP may be an organic light emitting display panel or a quantum dot light emitting display panel. A light emitting layer of the organic light emitting display panel may include an organic light emitting material. A light emitting layer of the quantum dot light emitting display panel may include a quantum dot or a quantum rod. Alternatively, the display panel DP may be a liquid crystal display panel including a liquid crystal layer. In the illustrated exemplary embodiment, the organic light emitting display panel will be described as the display panel DP.

The display panel DP may include a first substrate SUB1, a second substrate SUB2, a circuit element layer CL, a display element layer OL, and a sealing layer SL.

The first substrate SUB1 may be a rigid substrate. For example, the first substrate SUB1 may be a glass substrate. The first substrate SUB1 may include a display area DA and a non-display area NDA surrounding the display area DA. The display area DA and the non-display area NDA of the first substrate SUB1 may substantially correspond to the display area DA and the non-display area NDA of the display surface DS shown in FIG. 1, respectively.

The second substrate SUB2 may be disposed on the first substrate SUB1. A lower surface of the second substrate SUB2 may face an upper surface of the first substrate SUB1. In the illustrated exemplary embodiment, the second substrate SUB2 may be an encapsulation substrate. For example, the second substrate SUB2 may include a glass substrate.

The circuit element layer CL and the display element layer OL may be disposed between the first substrate SUB1 and the second substrate SUB2. The circuit element layer CL may include an insulating layer, a semiconductor pattern, a conductive pattern, and a signal line. Regarding the formation process of the circuit element layer CL, an insulating layer, a semiconductor layer, and a conductive layer may be formed on the first substrate SUB1 by coating and deposition processes, and then, the insulating layer, the semiconductor layer, and the conductive layer may be selectively patterned by a plurality of photolithography processes. Then, the semiconductor pattern, the conductive pattern, and the signal line of the circuit element layer CL may be formed. For example, the signal line may be a data line or a scan line.

The display element layer OL may be disposed on the display area DA. The display element layer OL may include a light emitting element. For example, the display element layer OL may include an organic light emitting material, a quantum dot, a quantum rod, or a micro-LED.

The sealing layer SL may be disposed between the first substrate SUB1 and the second substrate SUB2. The sealing layer SL may be disposed outside the display element layer OL and the circuit element layer CL. The sealing layer SL may overlap the non-display area NDA in the third direction D3. For example, the sealing layer SL may extend along an edge of the first substrate SUB1 and the second substrate SUB2. The sealing layer SL may include an insulating material. For example, the sealing layer SL may include a glass material.

The second substrate SUB2 and the sealing layer SL may protect the display element layer OL disposed on the first substrate SUB1. For example, the second substrate SUB2 and the sealing layer SL may prevent external moisture or foreign matter from entering the display element layer OL disposed on the first substrate SUB1 and may prevent defects in the light emitting element.

However, exemplary embodiments are not limited thereto. For example, the second substrate SUB2 and the sealing layer SL may be omitted from the display panel DP. For instance, the display panel DP may include a thin film encapsulation layer instead of the second substrate SUB2 and the sealing layer SL. For example, the thin film encapsulation layer may be disposed on the circuit element layer CL to cover the display element layer OL. The thin film encapsulation layer may include an inorganic layer, an organic layer, and an inorganic layer, which are sequentially stacked. The inorganic layers may include an inorganic material and may protect the display element layer OL from moisture and oxygen from the outside. The organic layer may include an organic material and may protect the display element layer OL from a foreign substance such as a dust particle.

The input sensing unit ISP may be disposed on the display panel DP. The input sensing unit ISP may sense an external input, e.g., a user's touch or proximity, convert the external input to a predetermined input signal, and provide the input signal to the display panel DP. The input sensing unit ISP may include a plurality of sensing electrodes to sense the external input. The sensing electrodes may sense the external input by a capacitive method. The display panel DP may receive the input signal from the input sensing unit ISP and may generate an image corresponding to the input signal.

The anti-reflective layer POL may be disposed on the input sensing unit ISP. The anti-reflective layer POL may reduce a reflectance of an external light incident to the display panel DP from the outside of the display device DD. As an example, the anti-reflective layer POL may include a retarder and/or a polarizer.

The window WIN may protect the display panel DP and the input sensing unit ISP from external scratches and impacts. The window WIN may be attached to the input sensing unit ISP by an adhesive. The adhesive may include an optical clear adhesive. The image generated by the display panel DP may be provided to the user through the window WIN.

The cover panel CV may be disposed under the display panel DP. The cover panel CV may include one or more functional layers. For example, the cover panel CV may include a cushion layer. The cushion layer may be a synthetic resin foam including a matrix member and a plurality of voids. The voids may absorb impacts applied to the display panel DP.

Figure 3:
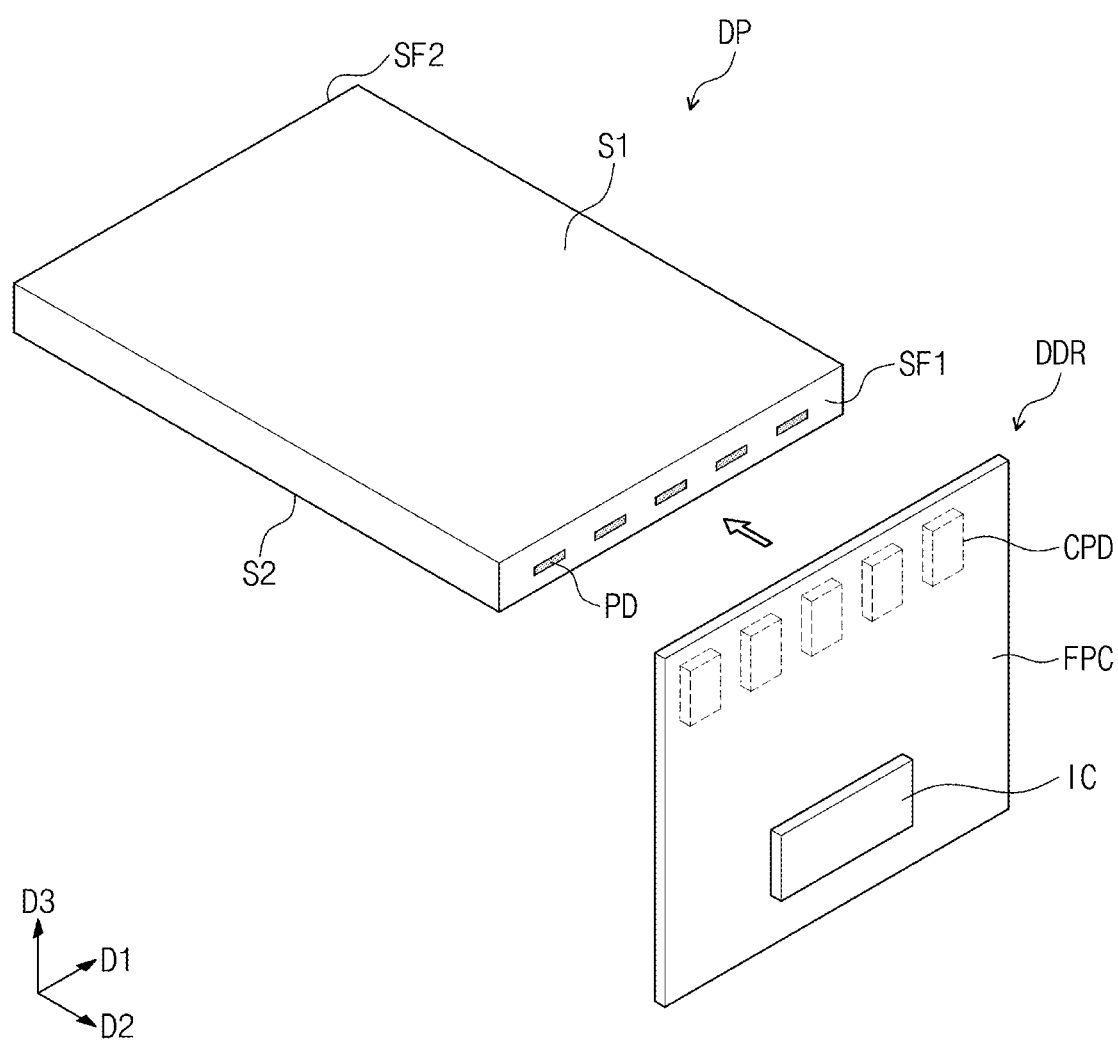
FIG. 3 is a perspective view of a display panel of the display device of FIG. 2 and a driver disposed on a side surface of the display panel.

FIG. 3 is a perspective view of the display panel DP of the display device DD and a driver DDR disposed on a side surface of the display panel DP according to an exemplary embodiment. For the convenience of explanation, FIG. 3 schematically shows the stack structure of the display panel DP.

Referring to FIG. 3, the display panel DP may include a first surface S1, a second surface S2, a first side surface SF1, and a second side surface SF2. The first surface S1 may define an upper surface of the display panel DP. The first surface S1 may be an area through which the image is displayed in the display panel DP. The second surface S2 may define a lower surface of the display panel DP. The second surface S2 may be opposite to the first surface S1 in the display panel DP.

The first side surface SF1 may be substantially parallel to a plane defined by the first direction D1 and the third direction D3. A plurality of pads PD may be disposed on the first side surface SF1. The pads PD may be spaced apart from each other in the first direction D1.

The pads PD may be disposed on the first substrate SUB1. The pads PD may be connected to the signal line of the circuit element layer CL (refer to FIG. 2). For example, each of the pads PD may be connected to a corresponding signal line of the circuit element layer CL. For example, the signal line may be a data line.

FIG. 3 shows five pads PD disposed on the first side surface SF1, however, exemplary embodiments are not limited thereto. For example, the number of the pads PD disposed on the first side surface SF1 may be greater than five. The second side surface SF2 may be opposite to the first side surface SF1.

The driver DDR may be disposed on the first side surface SF1 of the display panel DP. The driver DDR may generate signals and may apply the generated signals to the pads PD. For example, the driver DDR may generate data signals and may apply the data signals to the data line of the circuit element layer CL (refer to FIG. 2) through the pads PD.

The driver DDR may include connection pads CPD, a flexible circuit board FPC, and a driving chip IC. The connection pads CPD may be disposed on one surface of the flexible circuit board FPC. The one surface of the flexible circuit board FPC may face the first side surface SF1 of the display panel DP.

The connection pads CPD may be disposed to correspond to the pads PD. In detail, the connection pads CPD may be spaced apart from each other in the first direction D1. The connection pads CPD may be electrically connected to the pads PD, respectively.

The flexible circuit board FPC may be a flexible substrate. For example, a portion of the flexible circuit board FPC may be bent to be disposed under the second surface S2 of the display panel DP.

The driving chip IC may be disposed on an opposite surface of the flexible circuit board FPC. The opposite surface of the flexible circuit board FPC may be opposite to the one surface on which the connection pads CPD are disposed.

According to the exemplary embodiment, the driver DDR connected to the signal line through the pads PD may be connected to the first side surface SF1 of the display panel DP, and thus, a size of a bezel portion of the display device DD may be reduced.

Figure 4:
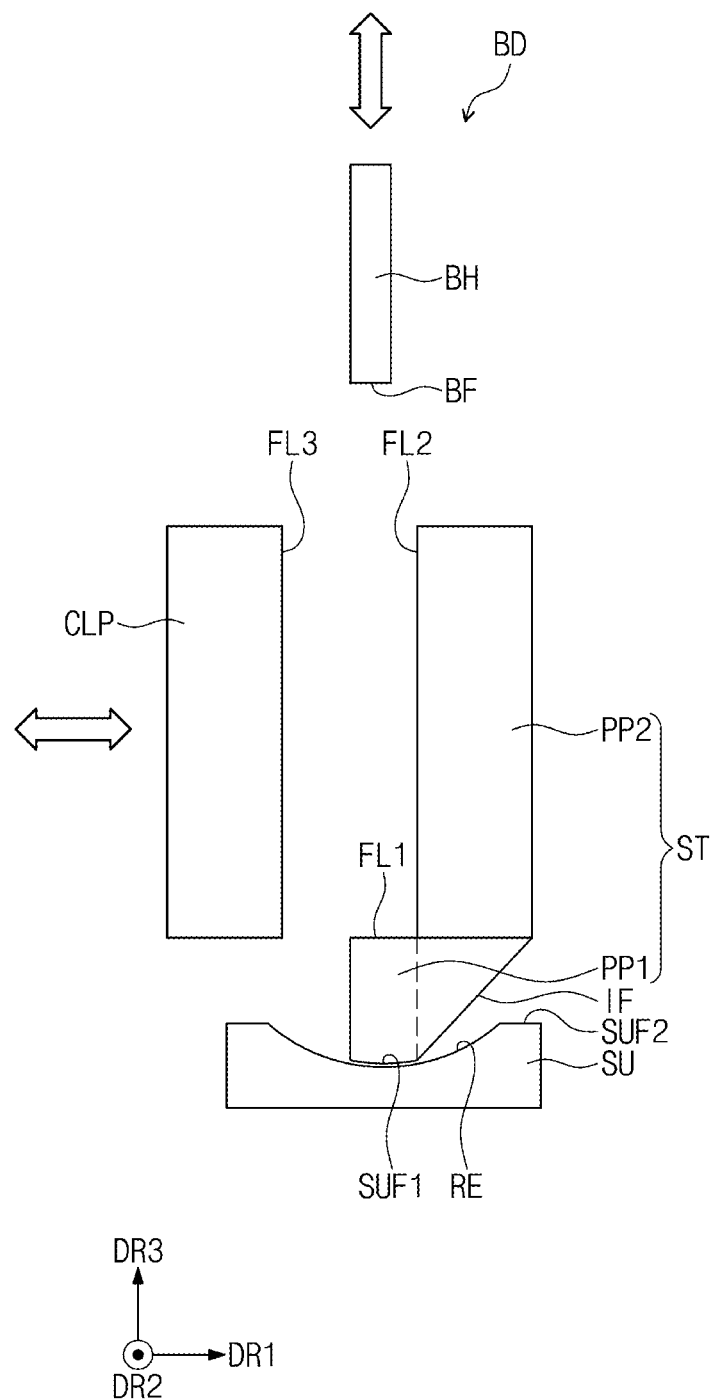
FIGS. 4 and 5 are plan views of an exemplary embodiment of a bonding device constructed according to the principles of the invention.
Figure 5:
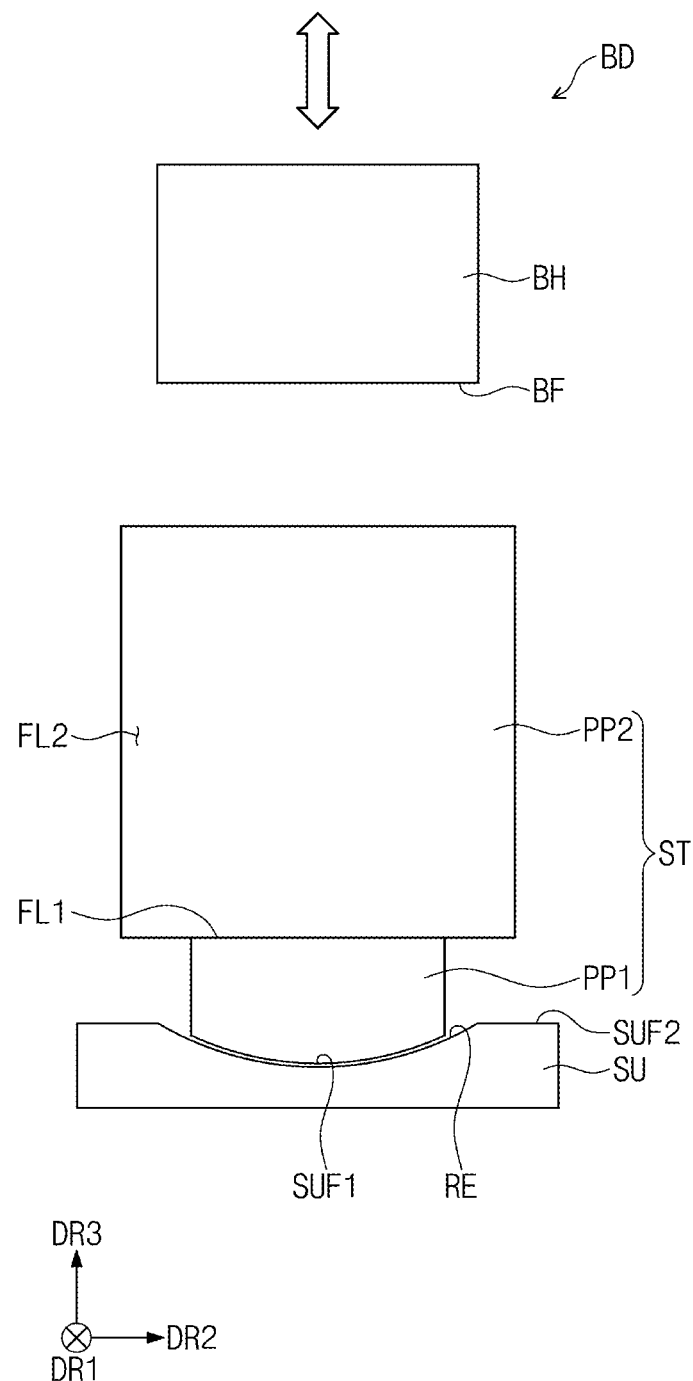

FIGS. 4 and 5 are plan views of an exemplary embodiment of a bonding device BD constructed according to the principles of the invention. FIG. 5 shows the bonding device BD when viewed from a third plane surface FL3 shown in FIG. 4.

Referring to FIGS. 4 and 5, the bonding device BD may be used to fix the driver DDR shown in FIG. 3 to the first side surface SF1 of the display panel DP. The bonding device BD may include a stage ST, a bonding head BH, a clamp CLP, and a supporter SU. A target object may be disposed on the stage ST. For instance, the target object may be the display panel DP shown in FIG. 3. The stage ST may have rigidity. For example, the stage ST may include a metal material.

The stage ST may include a first portion PP1 and a second portion PP2. The first portion PP1 and the second portion PP2 may be integrally formed with each other or may be connected to each other after being formed separately from each other. The first portion PP1 may include a first plane surface FL1 and a first support surface SUF1. The first plane surface FL1 may be substantially perpendicular to the third direction DR3. In other words, the first plane surface FL1 may be substantially parallel to a plane defined by the first direction DR1 and the second direction DR2.

The second side surface SF2 of the display panel DP may be placed on the first plane surface FL1. A width in the first direction DR1 of the first plane surface FL1 may be equal to or greater than a thickness of the second side surface SF2, i.e., a width in the third direction DR3 of the second side surface SF2, of the display panel DP shown in FIG. 3.

The first support surface SUF1 may be opposite to the first plane surface FL1. The first support surface SUF1 may define a lower surface of the first portion PP1. In the illustrated exemplary embodiment, the first support surface SUF1 may be a curved surface. For example, the first support surface SUF1 may have a shape that is convex downward.

The second portion PP2 may extend from one side of the first portion PP1 in a vertical direction, e.g., the third direction DR3. When viewed in plane, the first portion PP1 and the second portion PP2 may not overlap each other. The second portion PP2 may include a second plane surface FL2.

The second plane surface FL2 may be substantially parallel to a plane defined by the second direction DR2 and the third direction DR3. The second plane surface FL2 may be substantially perpendicular to the first plane surface FL1. For example, a plurality of suction holes may be defined in the second plane surface FL2. The suction holes may suck air between the second plane surface FL2 and the target object disposed on the second plane surface FL2 such that the target object is fixed to the second plane surface FL2.

The second surface S2 of the display panel DP may be disposed on the second plane surface FL2. A width of the second plane surface FL2 in the third direction DR3 may be smaller than a width in the second direction DR2 of the second surface S2 of the display panel DP shown in FIG. 3. For example, when the display panel DP is disposed on the second plane surface FL2, one end of the display panel DP may protrude beyond the second plane surface FL2 in the third direction DR3.

A lower surface of the second portion PP2 may be an inclined surface IF. For example, as shown in FIG. 4, the lower surface of the second portion PP2 may be inclined upwardly toward a right side in the first direction DR1.

The bonding head BH may be disposed on the stage ST. When viewed in plane (e.g., in the third direction DR3), the bonding head BH may overlap the first plane surface FL1 of the first portion PP1 and may not overlap the second portion PP2. A lower surface BF of the bonding head BH may face the first plane surface FL1. The lower surface BF of the bonding head BH may be substantially parallel to the surface defined by the first direction DR1 and the second direction DR2. The bonding head BH may move in the vertical direction (e.g., in the third direction DR3). For example, the bonding head BH may move in the third direction DR3 to be close to or far away from the first plane surface FL1.

The bonding head BH may electrically connect the pad PD of the display panel DP shown in FIG. 3 and the connection pad CPD of the driver DDR shown in FIG. 3. For example, the bonding head BH may fix the driver DDR to the first side surface SF1 of the display panel DP using at least one of a thermo-compression bonding method, an ultrasonic bonding method, and a laser bonding method.

In detail, the bonding head BH may include a pressure tip and a heater to apply a predetermined pressure and heat to the flexible circuit board. Alternatively, the bonding head BH may include an ultrasonic generator and an ultrasonic irradiation unit to apply an ultrasonic wave having a predetermined wavelength to between the connection pad CPD and the pad PD. Alternatively, the bonding head BH may include a laser irradiation unit to irradiate a laser beam to between the connection pad CPD and the pad PD. However, exemplary embodiments are not limited thereto or thereby.

The clamp CLP may be spaced apart from the second portion PP2 of the stage ST in the first direction DR1. The clamp CLP may include the third plane surface FL3. The third plane surface FL3 may face the second plane surface FL2. For example, the first plane surface FL1 may not overlap the second plane surface FL2 or third plane surface FL3 in the first direction DR1. Alternatively, the first plane surface FL1 may partially overlap the second plane surface FL2 in the first direction DR1

The clamp CLP may move in the first direction DR1. The clamp CLP may be selectively in contact with the target object disposed on the stage ST. For example, the clamp CLP may move to be close to or far away from the second portion PP2. In other words, a distance between the third plane surface FL3 and the second plane surface FL2 may vary.

The supporter SU may be disposed under the stage ST. The supporter SU may include a second support surface SUF2. The second support surface SUF2 of the supporter SU may face the first support surface SUF1 of the first portion PP1 of the stage ST. A recess portion RE may be defined in the second support surface SUF2 of the supporter SU. For example, the recess portion RE may have a curved shape that is concaved from an upper surface of the supporter SU toward a lower surface of the supporter SU. The first support surface SUF1 may be in contact with an upper surface of the recess portion RE of the second support surface SUF2. Accordingly, the supporter SU may support the stage ST.

Figure 6:
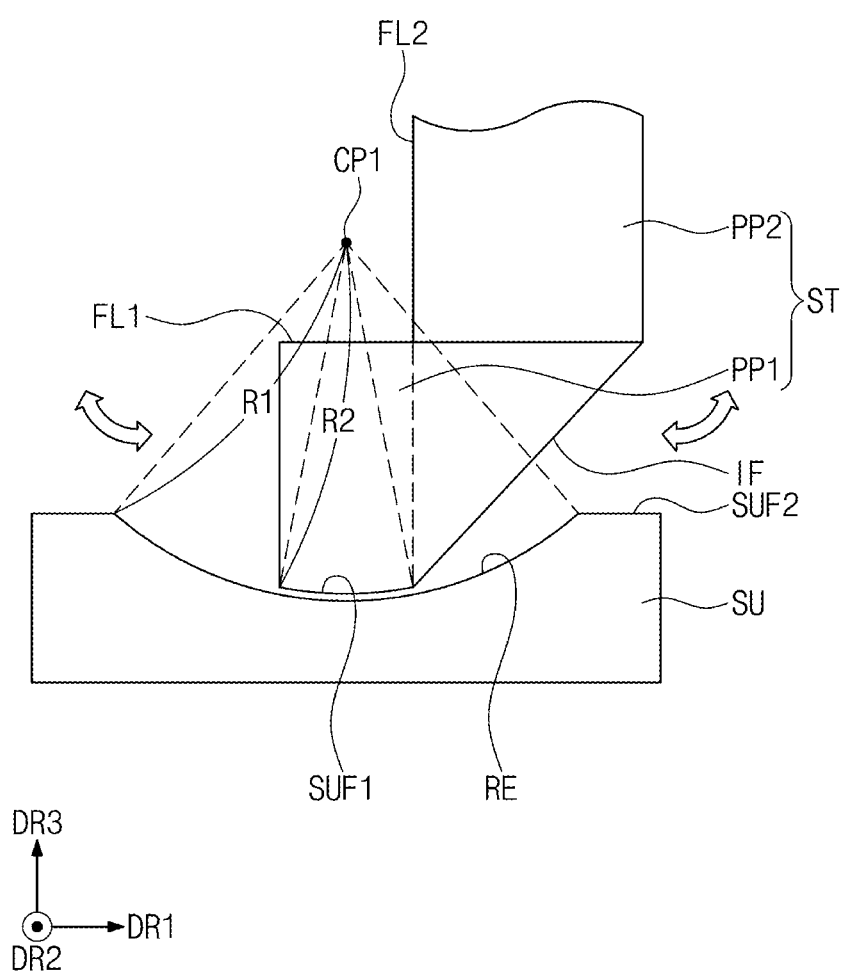
FIGS. 6 and 7 are plan views illustrating a connection relationship between a stage and a supporter of the bonding device of FIG. 4.
Figure 7:
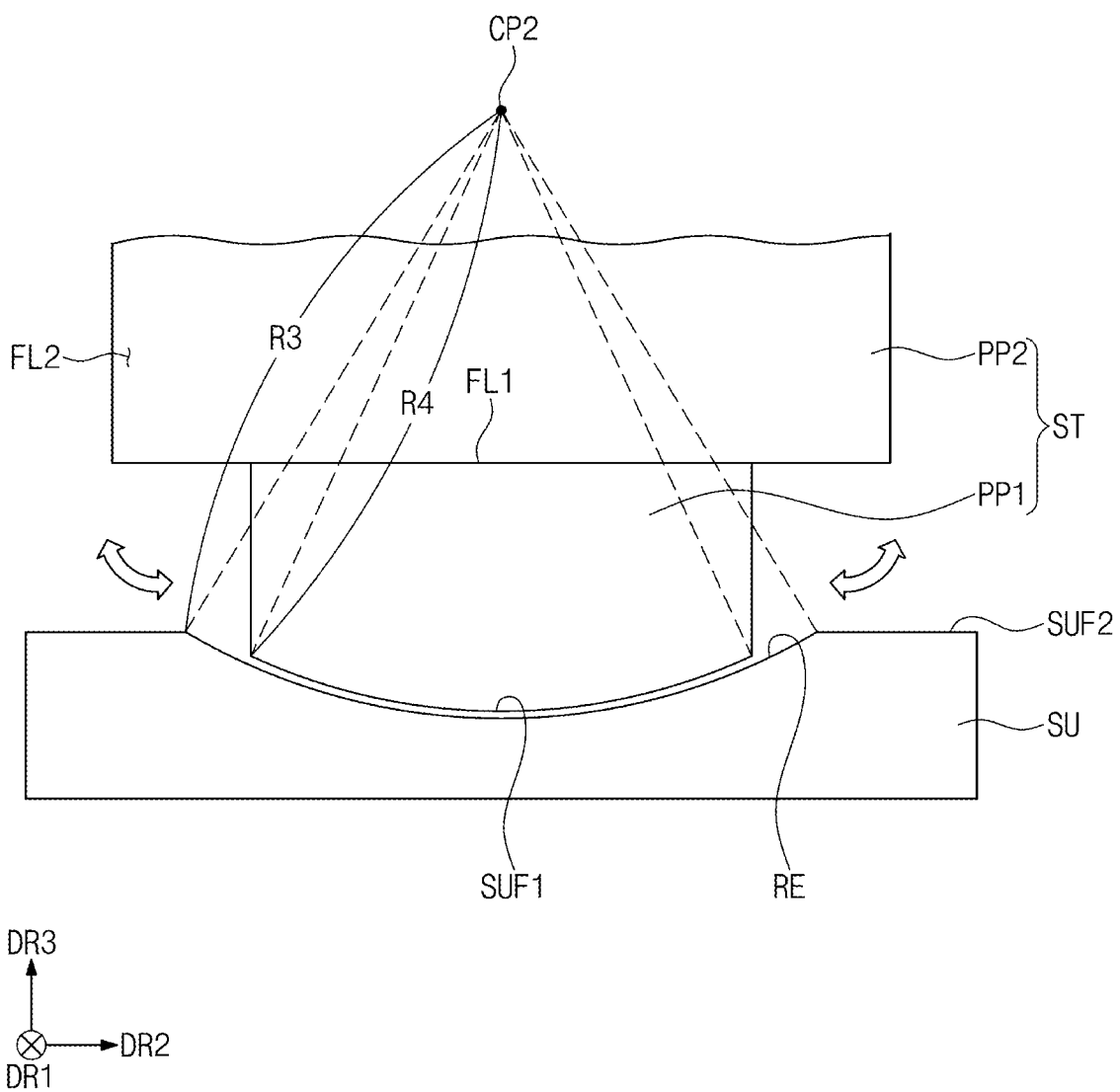

FIGS. 6 and 7 are plan views illustrating a connection relationship between the stage ST and the supporter SU of FIG. 4. In FIGS. 6 and 7, the first support surface SUF1 is spaced apart from the second support surface SUF2, however, the first support surface SUF1 is substantially in contact with the second support surface SUF2. For the convenience of explanation, FIGS. 6 and 7 show only a lower portion of the stage ST and the supporter SU disposed under the stage ST.

Referring to FIG. 6, a center of curvature of the recess portion RE in the first direction DR1 may be a first virtual point CP1. The recess portion RE may have a first radius of curvature R1. A center of curvature of the first support surface SUF1 may be the same as the center of curvature of the recess portion RE. For example, the center of curvature of the first support surface SUF1 may be the first virtual point CP1. The first support surface SUF1 may have a second radius of curvature R2. In the illustrated exemplary embodiment, the first radius of curvature R1 may be the same as the second radius of curvature R2. Consequently, the first support surface SUF1 may have the same curvature as that of the recess portion RE in the first direction DR1.

However, exemplary embodiments are not limited thereto. For example, the second radius of curvature R2 may be different from the first radius of curvature R1. For example, the second radius of curvature R2 may be smaller than the first radius of curvature R1. In this case, the curvature of the first support surface SUF1 may be greater than the curvature of the recess portion RE in the first direction DR1.

A width of the recess portion RE of the supporter SU may be greater than a width of the first support surface SUF1 of the stage ST in the first direction DR1. The first support surface SUF1 of the stage ST may move in the first direction DR1 on the upper surface of the recess portion RE of the supporter SU. As the first support surface SUF1 of the stage ST may move on the recess portion RE of the supporter SU, the horizontal level of the first plane surface FL1 of the stage ST with respect to the first direction DR1 may vary.

Referring to FIG. 7, the center of curvature of the recess portion RE of the supporter SU in the second direction DR2 may be a second virtual point CP2. The recess portion RE of the supporter SU may have a third radius of curvature R3. A center of curvature of the first support surface SUF1 of the stage ST in the second direction DR2 may be the second virtual point CP2. The first support surface SUF1 of the stage ST may have a fourth radius of curvature R4. In the illustrated exemplary embodiment, the third radius of curvature R3 of the recess portion RE of the supporter SU may be the same as the fourth radius of curvature R4 of the first support surface SUF1 of the stage ST. Consequently, the first support surface SUF1 of the stage ST may have the same curvature as that of the recess portion RE of the supporter SU in the second direction DR2.

However, exemplary embodiments are not limited thereto. For example, the fourth radius of curvature R4 of the first support surface SUF1 of the stage ST may be different from the third radius of curvature R3 of the recess portion RE of the supporter SU. For example, the fourth radius of curvature R4 may be smaller than the third radius of curvature R3. In this case, the curvature of the first support surface SUF1 of the stage ST may be greater than the curvature of the recess portion RE of the supporter SU in the second direction DR2.

A width of the recess portion RE of the supporter SU may be greater than a width of the first support surface SUF1 of the stage ST in the second direction DR2. The first support surface SUF1 of the stage ST may move in the second direction DR2 on the recess portion RE of the second support surface SUF2 of the supporter SU. As the first support surface SUF1 of the stage ST may move on the recess portion RE of the supporter SU, the horizontal level of the first plane surface FL1 with respect to the second direction DR2 may vary.

However, exemplary embodiments are not limited thereto. For example, each of the widths of the recess portion RE of the supporter SU in the first and second directions DR1 and DR2 may be equal to or smaller than the width of the first support surface SUF1 of the stage ST in the first direction DR1 and the width of the first support surface SUF1 of the stage ST in the second direction DR2.

Consequently, as the first support surface SUF1 of the stage ST moves on the recess portion RE of the supporter SU, an angle between the first plane surface FL1 of the stage ST and each of the first and second directions DR1 and DR2 may vary.

Figure 8:
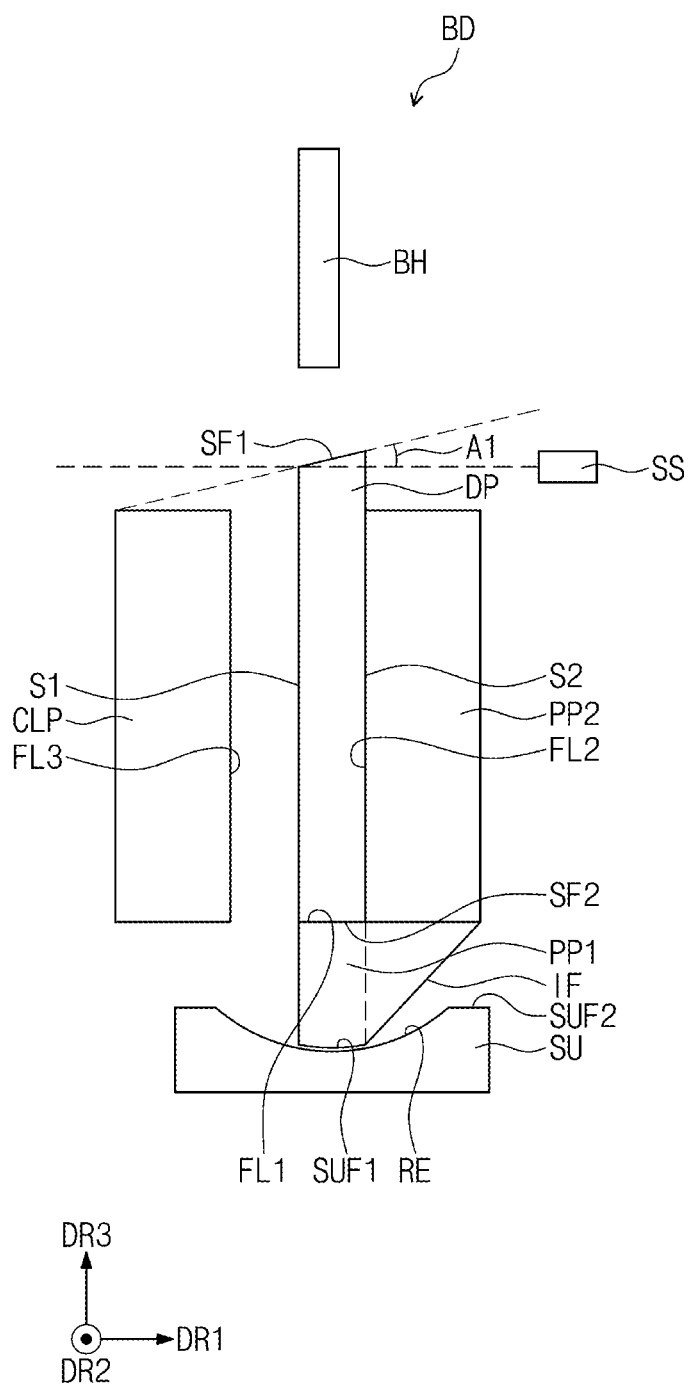
FIGS. 8, 9, 10, and 11 are plan views illustrating a manufacturing process of the display device of FIG. 1 by using the bonding device of FIG. 4.
Figure 9:
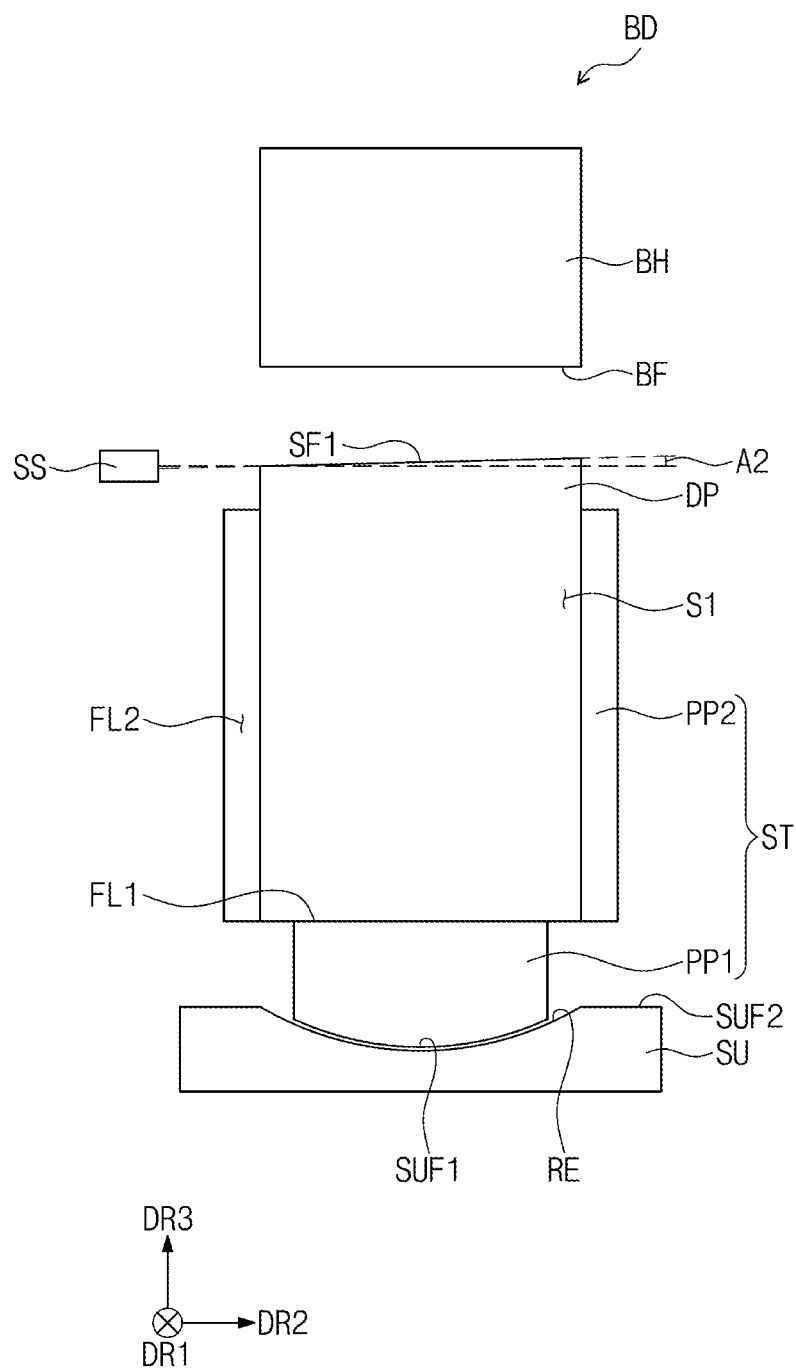
Figure 10:
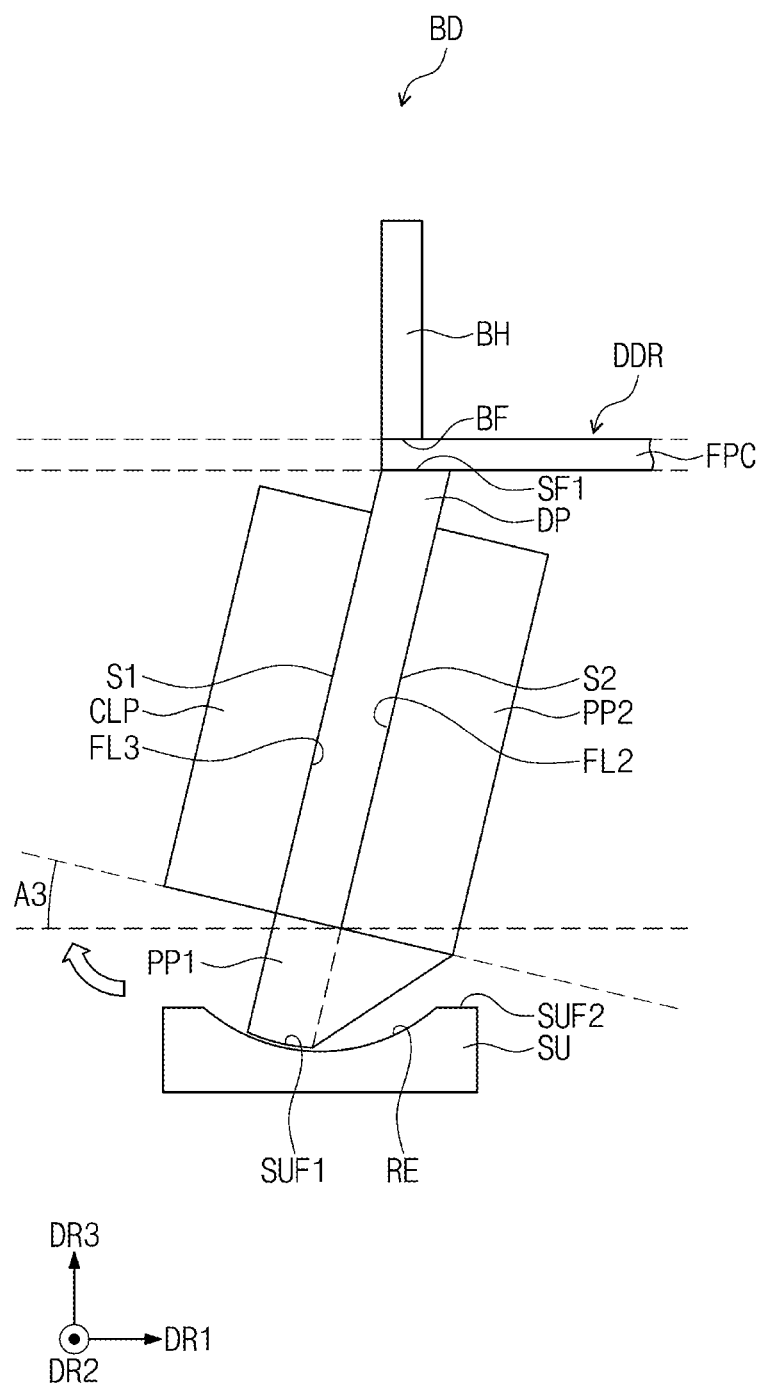
Figure 11:
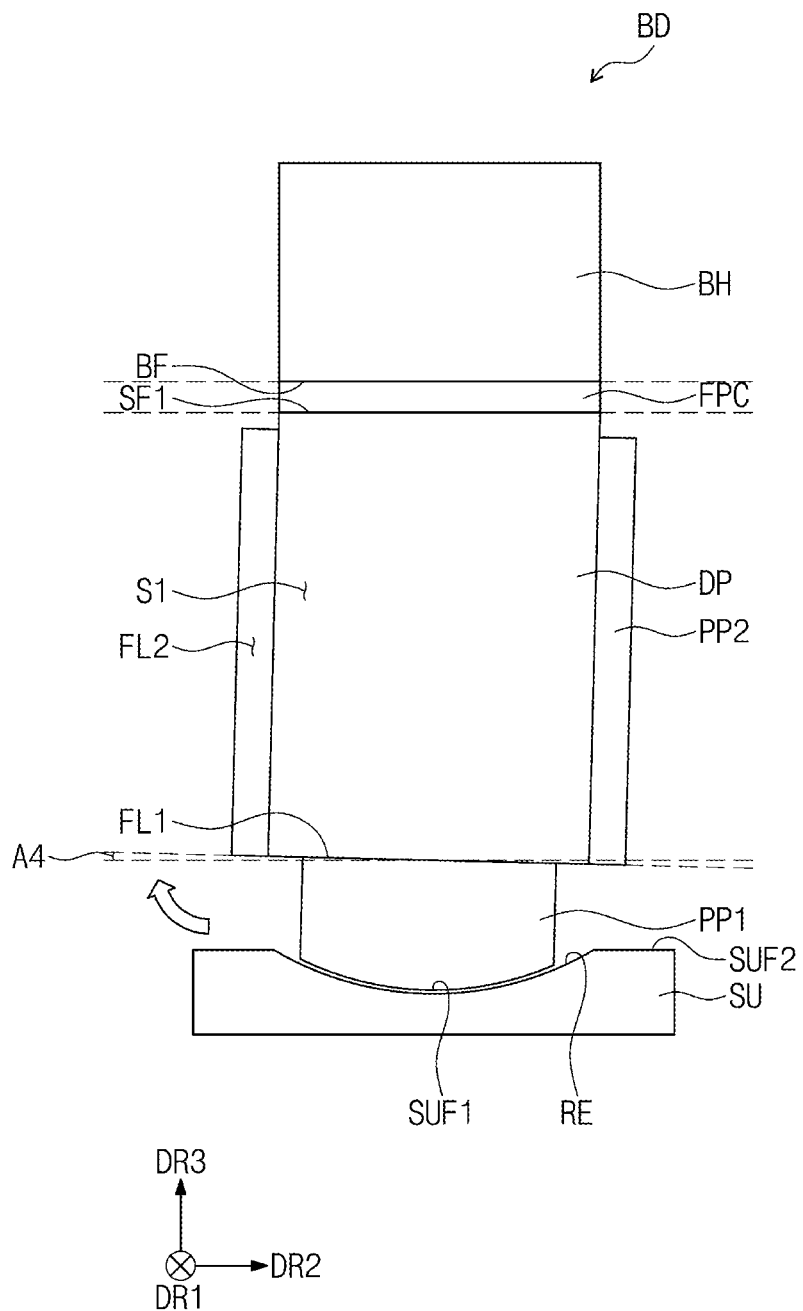

FIGS. 8 to 11 are plan views illustrating a manufacturing process of the display device DD of FIG. 1 by using the bonding device BD of FIG. 4. FIGS. 9 and 11 show the bonding device BD when viewed from the third plane surface FL3 of FIGS. 8 and 10, respectively.

Referring to FIGS. 3, 8, and 9, the display panel DP may be placed on the stage ST. In detail, the second side surface SF2 of the display panel DP may be disposed on the first plane surface FL1 of the first portion PP 1.

The second surface S2 of the display panel DP may be disposed on the second plane surface FL2 of the stage ST. The second surface S2 of the display panel DP may be fixed to the second plane surface FL2 of the stage ST. For example, the display panel DP may be vacuum-adsorbed to the second plane surface FL2 of the stage ST by the suction holes defined in the second plane surface FL2. The first side surface SF1 of the display panel DP may protrude beyond the second portion PP2 of the stage ST in the third direction DR3.

The first side surface SF1 of the display panel DP may be inclined with respect to the first direction DR1 or the second direction DR2. The inclination of the first side surface SF1 of the display panel DP may occur during a process of cutting a mother substrate.

A sensor SS may measure a horizontal level of the first side surface SF1 of the display panel DP. For example, the sensor SS may measure an angle between the first side surface SF1 and the first direction DR1 and an angle between the first side surface SF1 of the display panel DP and the second direction DR2. In the illustrated exemplary embodiment, it is assumed that the first side surface SF1 of the display panel DP forms a first angle A1 with respect to the first direction DR1, and the first side surface SF1 of the display panel DP forms a second angle A2 with respect to the second direction DR2. In this case, the first plane surface FL1 may be substantially parallel to a plane defined by the first direction DR1 and the second direction DR2.

Referring to FIGS. 3, 10, and 11, the stage ST may control the first side surface SF1 of the display panel DP to be substantially parallel to the first direction DR1 and the second direction DR2. In detail, the first support surface SUF1 of the first portion PP1 of the stage ST may move to a left side on the recess portion RE of the supporter SU in the first direction DR1. Accordingly, the first plane surface FL1 of the stage ST may form a third angle A3 with respect to the first direction DR1. The third angle A3 may be substantially the same as the first angle A1. Consequently, as the first plane surface FL1 of the stage ST is inclined with respect to the first direction DR1 by the third angle A3, the first side surface SF1 of the display panel DP may be substantially parallel to the first direction DR1.

The first support surface SUF1 of the first portion PP1 of the stage ST may move to a left side of the recess portion RE of the supporter SU in the second direction DR2. Accordingly, the first plane surface FL1 of the stage ST may form a fourth angle A4 with respect to the second direction DR2. The fourth angle A4 may be substantially the same as the second angle A2. Consequently, as the first plane surface FL1 of the stage ST is inclined with respect to the second direction DR2 by the fourth angle A4, the first side surface SF1 of the display panel DP may be substantially parallel to the second direction DR2.

Consequently, as the first portion PP1 of the stage ST moves on the recess portion RE of the supporter SU, the first side surface SF1 may be substantially parallel to the plane defined by the first direction DR1 and the second direction DR2.

The clamp CLP may move to be close to the second portion PP2 of the stage ST. The third plane surface FL3 of the clamp CLP may be in contact with the first surface S1 of the display panel DP. The clamp CLP may fix the display panel DP to the stage ST.

The flexible circuit board FPC of the driver DDR may be disposed on the first side surface SF1 of the display panel DP. For example, the flexible circuit board FPC may be provided by a separate handler.

The bonding head BH may move in a downward direction (e.g., in the opposite direction of the third direction DR3). The bonding head BH may be in contact with an upper surface of the flexible circuit board FPC. The bonding head BH may fix the flexible circuit board FPC to the first side surface SF1 of the display panel DP using at least one of a thermo-compression bonding method, an ultrasonic bonding method, and a laser bonding method. The lower surface BF of the bonding head BH may be substantially parallel to the plane defined by the first direction DR1 and the second direction DR2. The lower surface BF of the bonding head BH and the first side surface SF1 of the display panel DP may be substantially parallel to each other.

According to the exemplary embodiment, the horizontal level of the first side surface SF1 of the display panel DP may be controlled such that the bonding process is performed while the first side surface SF1 of the display panel DP and the lower surface BF of the bonding head BH are parallel to each other. Accordingly, the bonding process may be uniformly performed between the first side surface SF1 of the display panel DP and the flexible circuit board FPC of the driver DDR. Consequently, a bonding quality by the bonding device BD may be improved, and defects of the display device (e.g. refer to "DD" in FIG. 1) may be reduced.

Figure 12:
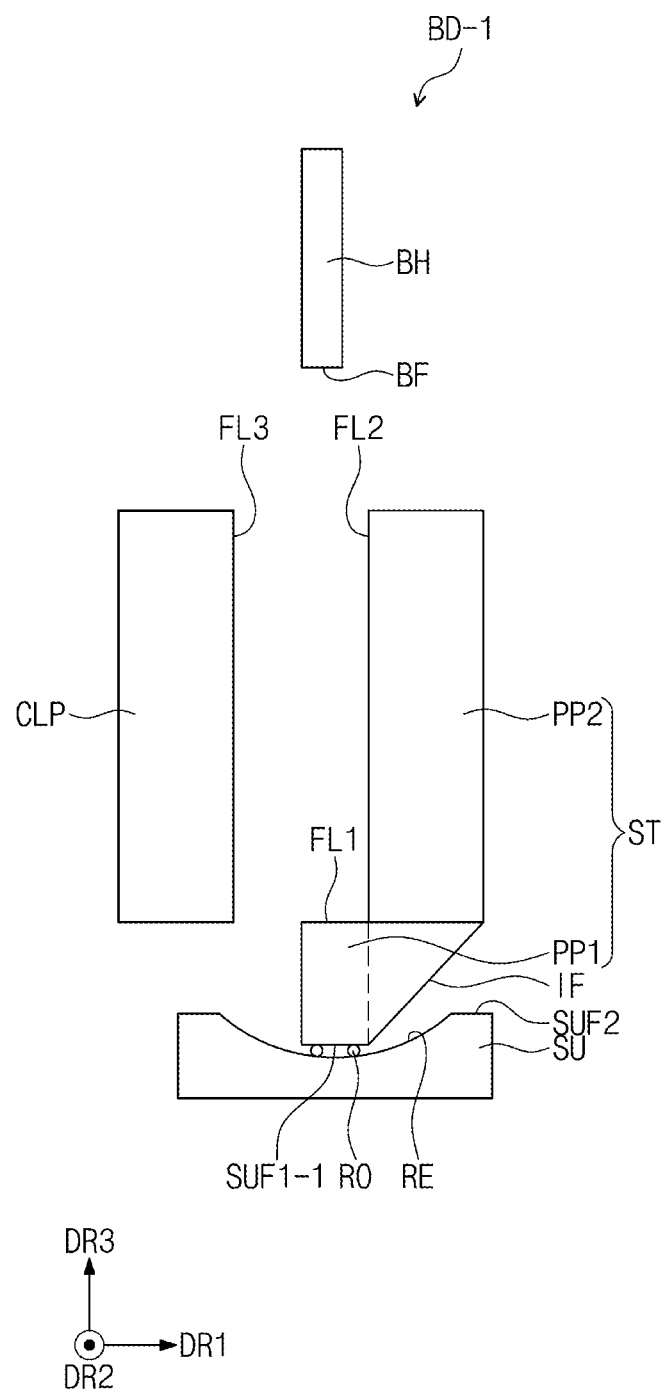
FIGS. 12 and 13 are plan views of another exemplary embodiment of a bonding device constructed according to the principles of the invention.
Figure 13:
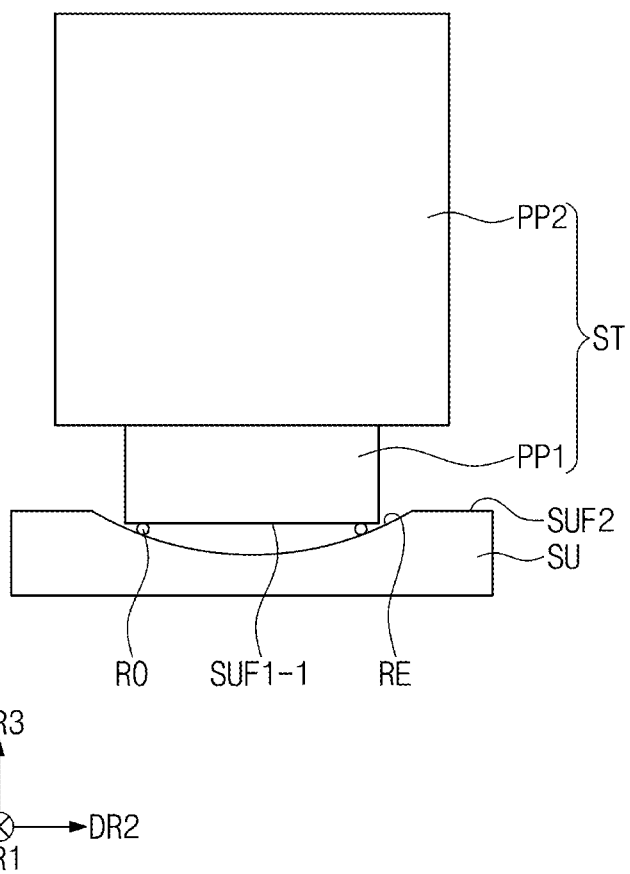

FIGS. 12 and 13 are plan views of another exemplary embodiment of a bonding device BD-1 constructed according to the principles of the invention.

Hereinafter, the bonding device BD-1 according to the exemplary embodiment will be described. In FIGS. 12 and 13, the same reference numerals denote the same elements in the above-described bonding device BD, and thus, detailed descriptions of the same elements will be omitted and different features will be mainly described.

Referring to FIGS. 12 and 13, the bonding device BD-1 may include at least one rotator RO disposed between the first portion PP1 of the stage ST and the supporter SU. In the illustrated exemplary embodiment, a first support surface SUF1-1 may be a plane. In detail, the first support surface SUF1-1 may be substantially parallel to a plane defined by the first direction DR1 and the second direction DR2. The first support surface SUF1-1 may be substantially parallel to a first plane surface FL1.

The rotator RO may be disposed under the first support surface SUF1-1. The rotator RO may be rotatably fixed to the first support surface SUF1-1. For example, the rotator RO may be a ball caster.

In the illustrated exemplary embodiment, the rotator RO may be provided in plural, and the rotators RO may be disposed under the first support surface SUF1-1 of the stage ST. For example, four rotators RO may be disposed under the first support surface SUF1-1 of the stage ST, and thus, two rotators RO may be shown when viewed in the first direction DR1 and two rotators RO may be shown when viewed in the second direction DR2. For example, the four rotators RO may be disposed in two-by-two matrix under the first support surface SUF1-1. However, the number of the rotators RO disposed under the first support surface SUF1-1 may vary.

According to the exemplary embodiment, as the rotators RO move on a recess portion RE of a second support surface SUF2 of the supporter SU, a horizontal level of the first plane surface FL1 with respect to the first direction DR1 and the second direction DR2 may vary. For example, the bonding device BD-1 may include a member used to maintain an inclination of the first plane surface FL1.

Consequently, the bonding device BD-1 may control a horizontal level of a side surface facing the bonding head BH, of the target object (e.g., the display panel DP, refer to FIG. 3) disposed on the stage ST.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A bonding device comprising:
a bonding head having a lower surface and configured to move in a vertical direction;
a stage disposed under the bonding head and comprising a first portion, the first portion having a first substantially planar surface facing the bonding head and a first support surface opposite to the first substantially planar surface; and
a supporter disposed under the stage and comprising a second support surface facing the first support surface,
wherein the second support surface of the supporter has a recess portion having a first radius of curvature, and the lower surface of the bonding head is substantially parallel to the first substantially planar surface.

2. The bonding device of claim 1, wherein the first support surface of the first portion of the stage comprises a curved surface convex in a downward direction, and the curved surface has a second radius of curvature.

3. The bonding device of claim 2, wherein the first radius of curvature of the recess portion of the second support surface of the supporter is substantially equal to the second radius of curvature of the curved surface of the first portion of the stage.

4. The bonding device of claim 1, wherein the recess portion of the second support surface of the supporter has an area greater than an area of the first support surface of the first portion of the stage when viewed in plan.

5. The bonding device of claim 1, wherein the stage further comprises a second portion extending from one side of the first portion of the stage in the vertical direction, and the second portion of the stage comprises a second substantially planar surface substantially perpendicular to the first substantially planar surface of the first portion of the stage.

6. The bonding device of claim 5, further comprising a clamp spaced apart from the second portion of the stage in a horizontal direction substantially perpendicular to the vertical direction.

7. The bonding device of claim 6, wherein the clamp is configured to move in the horizontal direction to be close to or far away from the second substantially planar surface of the second portion of the stage.

8. The bonding device of claim 1, wherein the bonding head is configured to apply heat and pressure to a target object.

9. The bonding device of claim 1, wherein the bonding head is configured to apply an ultrasonic wave to a target object.

10. The bonding device of claim 1, wherein the bonding head is configured to irradiate a laser beam to a target object.

11. The bonding device of claim 1, further comprising at least one ball caster rotatably coupled to the first support surface.

12. The bonding device of claim 11, wherein the first support surface of the first portion of the stage is substantially parallel to the first substantially planar surface of the first portion of the stage.

13. The bonding device of claim 1, further comprising a target object disposed on the stage,
wherein one side surface of the target object is disposed on the first substantially planar surface of the first portion of the stage, and another side surface of the target object which is opposite to the one side surface of the target object, faces the bonding head.

14. A bonding device comprising:
a stage comprising a first portion, the first portion having a first substantially planar surface on which a first side surface of a display panel is disposed and a first support surface opposite to the first substantially planar surface;
a bonding head having a lower surface being substantially parallel to the first substantially planar surface and disposed on the stage and configured to move to be close to or far away from a second side surface of the display panel opposite to the first side surface of the display panel; and
a supporter disposed under the stage and comprising a second support surface facing the first support surface and having a curved surface area.

15. The bonding device of claim 14, wherein:
the second support surface of the supporter has a curved surface concave in a downward direction, and
the first support surface of the first portion of the stage has a curved surface convex in the downward direction.

16. The bonding device of claim 15, wherein the first support surface of the first portion of the stage has a radius of curvature substantially equal to a radius of curvature of the second support surface of the supporter.

17. The bonding device of claim 14, wherein the bonding head is configured to bond a flexible circuit board disposed on the second side surface to the second side surface using one of a thermal-compression bonding method, an ultrasonic bonding method, and a laser bonding method.

18. The bonding device of claim 14, further comprising one or more ball casters disposed between the first support surface of the first portion of the stage and the second support surface of the supporter, wherein the first support surface of the first portion of the stage is substantially parallel to the first substantially planar surface of the first portion of the stage.

19. The bonding device of claim 14, further comprising a clamp, wherein:
the stage comprises a second portion having a second substantially planar surface, the second substantially planar surface substantially perpendicular to the first substantially planar surface of the first portion of the stage, on which a second surface of the display panel is placed, and
the clamp comprises a third substantially planar surface being selectively in contact with a first surface of the display panel opposite to the second surface of the display panel.

20. A bonding device comprising:
a bonding head configured to move in a vertical direction and to i) apply an ultrasonic wave to a target object, or ii) irradiate a laser beam to a target object;
a stage disposed under the bonding head and comprising a first portion having a first substantially planar surface facing the bonding head and a first support surface opposite to the first substantially planar surface; and
a supporter disposed under the stage and comprising a second support surface facing the first support surface,
wherein the second support surface of the supporter has a recess portion having a first radius of curvature.

* * * * *